United States Patent [19]

Tissot

[11] 4,242,633
[45] Dec. 30, 1980

[54] INTEGRATED CIRCUIT LIGHT EMITTING ELECTRONIC MALFUNCTION CHECKING SYSTEM

[76] Inventor: Pierre L. Tissot, 863 Via de la Paz, Pacific Palisades, Calif. 90272

[21] Appl. No.: 31,948

[22] Filed: Apr. 20, 1979

[51] Int. Cl.³ .............................................. G01R 15/12
[52] U.S. Cl. .............................. 324/73 R; 324/158 R
[58] Field of Search .......... 324/133, 73 R, 51, 158 R, 324/73 PC, 72 R; 339/113 B, 113 R

[56] References Cited

U.S. PATENT DOCUMENTS

| T930,006 | 1/1975 | Beaufrere et al. | 324/51 |
| 3,931,574 | 1/1976 | Curtis, Jr. et al. | 324/51 |

*Primary Examiner*—David K. Moore
*Attorney, Agent, or Firm*—Ralph B. Pastoriza

[57] ABSTRACT

An electronic apparatus is constructed in the conventional modern (cheapest) way by utilizing one single large etch foiled circuit board with directly soldered in or pluggable (replaceable) chips incorporating microcircuits. Each chip carries its own top side cold light emitting diode which is not energized during normal operation of the chip. Selected first and second pins of the various plurality of connecting pins for the chip may be temporarily short-circuited such as being touched with the tip of a screw driver. The chip is designed such that shorting of these first and second pins only will energize the light emitting diode only if the chip is good and there is power going to the circuit. Thus, part of each chip is a circuit analyzing (normally dormant) circuit. Determination of malfunctioning chips and replacement thereof is thus greatly simplified for the serviceman.

3 Claims, 3 Drawing Figures

INTEGRATED CIRCUIT LIGHT EMITTING ELECTRONIC MALFUNCTION CHECKING SYSTEM

This invention relates generally to electronic apparatus and more particularly to a checking system for use by servicemen in detecting malfunctioning chips on a single large etch foiled circuit board.

BACKGROUND OF THE INVENTION

Many different types of electronic apparatus including television receivers as well as computer circuitry are presently manufactured in the form of a single large etch foiled printed circuit board and associated chips incorporating micro circuits. These chips are normally provided with a plurality of connecting pins which are directly soldered in the circuit board making connections with appropriate etch-foiled circuit paths. In some instances, the chip pins are so designed as to be manually pluggable into receiving sockets and removable therefrom.

Each of the chips themselves are specially manufactured devices which may incorporate literally hundreds of diodes, transistors, gate generators and the like in the form of micro-circuitry. Essentially, a single chip can perform functions which heretofore often required a "roomful" of electronic equipment.

Because the chips themselves are each complex devices, in servicing electronic chassis employing such chips, the usual procedure is simply to determine a malfunctioning chip and replace that chip rather than attempt to diagnose the particular malfunction in the micro-circuitry within the chip. However, even with this type of simplification there is involved a time consuming operation on the part of the servicemen to determine precisely which chip is malfunctioning so that it can be replaced. Where the chip is of the manually pluggable and removable type, the situation is somewhat easier as compared to the case where the chip connecting pins are soldered into the circuit board. In the latter instance, in order to check the various chips, the serviceman must normally unsolder all of the connecting pins utilizing special tools and equipment.

BRIEF DESCRIPTION OF THE PRESENT INVENTION

Bearing the foregoing considerations in mind, the present invention contemplates the provision of an electronic chassis supporting a plurality of chips each of the type containing micro-circuitry and tapering pins wherein slight modifications are made in order to effectively simplify malfunctional checking of the system by a serviceman, all to the end that replacement of malfunctioning chips can more readily be carried out than has been possible heretofore.

Essentially, in accord with the present invention, a normally de-energized light emitting diode visible from the exterior of the chip is energized and provided on a top side portion of each chip. An amplifier circuit in turn is built into the chip and connected to the micro-circuitry in the chip, the amplifier circuit being biased to provide sufficient voltage to energize the light emitting diode only when connected thereto and only so long as the micro-circuitry is functioning normally. Specially selected first and second adjacent ones of the connecting tapering pins of the chip respectively connect to the output of the amplifier circuit and to the light emitting diode. With this arrangement, short circuiting of the first and second pins connects the light emitting diode to the amplifier circuit for energization thereby provided the referred to sufficient voltage is present.

With the foregoing arrangement, a serviceman can now readily check for malfunctioning chips without ever having to remove the chip from the chassis or circuit board by simply short circuiting the first and second tapering pins with a conducting probe, which, in its simplest form may even be the unconnected blade of a screw driver, and observing whether or not the light emitting diode is energized.

In addition, it should be further noted that the somewhat limited life expectancy of the light emitting diodes is not a problem since they are normally de-energized. Only when purposely energized by the shorting of the pins by the serviceman is any drain placed on the light emitting diode. Moreover, should the chip be malfunctioning, the diode will not be energized and thus the serviceman knows immediately that such chip is the malfunctioning one to be placed.

BRIEF DESCRIPTION OF THE DRAWINGS

A better understanding of this invention will be had by now referring to a preferred embodiment thereof as illustrated in the accompanying drawings in which.

DETAILED DESCRIPTION OF THE PREFERRED EMBODIMENT

Figure 1:
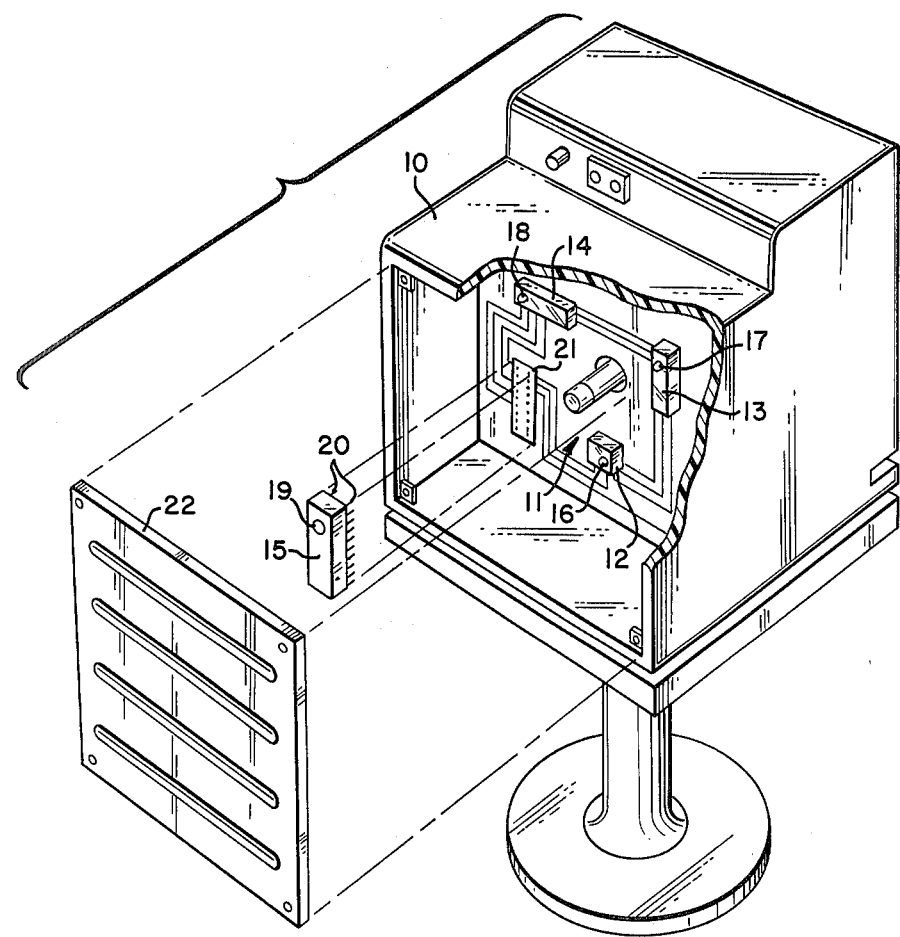
FIG. 1 is a broken away perspective view of a television receiver with the back panel exploded away to reveal and electronic chassis utilizing chip wherein the chips are designed in accord with the present invention and further wherein one of the chips is shown exploded away from the chassis.

Referring first to FIG. 1, there is shown by way of example, a television receiver 10 incorporating a large single etch-foiled circuit board 11 supporting a plurality of chips three of which are shown secured to the board at 12, 13 and 14. A fourth chip 15 in turn is shown exploded away from the board of FIG. 1.

Each of the various chips contains micro-circuitry and in accord with the present invention, each of the chips is further provided with a normally de-energized light emitting diode visible from the exterior of the chip when energized. Thus there is indicated at 16, 17, 18 and 19 light emitting diodes for the four chips 12, 13, 14 and 15 respectively.

Still referring to FIG. 1, it will be noted for the chip 15 that the same includes a plurality of connecting pins 20. In the example shown, it is assumed merely as an example that the chip 15 is of the manually pluggable and unpluggable type and towards this end, there is accordingly provided an appropriate pin receiving socket structure 21 on the printed circuit board 11. Others of the chips illustrated could be of the manually pluggable and unpluggable type or alternatively could have their pins soldered into various circuit paths in the board. In the latter event, removal of the chip requires special equipment.

A back panel is shown in FIG. 1 at 22 for closing the rear of the television receiver 10. It should be understood that while a television receiver is illustrated, the present invention is workable with any electronic apparatus incorporating chips on a large circuit board.

Figure 2:
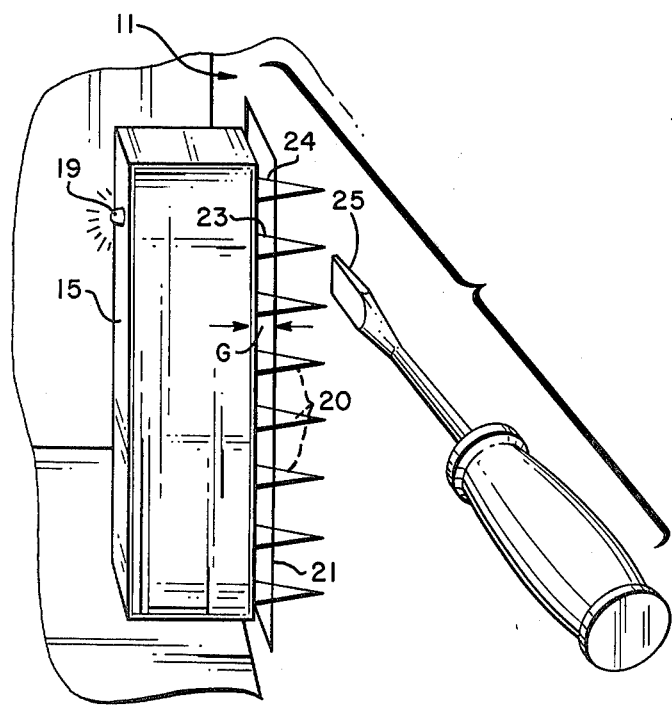
FIG. 2 is a greatly enlarged fragmentary perspective view of the exploded away chip of FIG. 1 in position on the chassis preparatory to being "checked" by a serviceman; and, FIG. 3 is a schematic basic circuit diagram illustrating modifications of the chips in accord with the present invention.

Referring now to FIG. 2, the chip 15 is shown in its normal fully inserted position in the socket 21 on the board 11. As shown, selected first and second ones of the pins 20 indicated at 23 and 24 are provided and connected into the micro-chip circuitry in such a manner that short-circuiting of these pins will energize the light emitting diode 19 only if the chip is functioning properly.

Thus, as illustrated in FIG. 2, a serviceman can utilize an appropriate probe such as a simple small screwdriver 25 to effect short circuiting of the two pins 23 and 24 and he can then observe whether or not the light emitting diode 19 is energized. If it is energized, the serviceman then knows immediately that the chip 15 is functioning properly and he can then proceed to the next chip and conduct a similar test.

With respect to the foregoing, it is a characteristic of the circuit boards and chips as presently manufactured that a small gap G exists between the underside of the chip and the board even when the connecting pins are "fully inserted" or simply soldered as the case may be. This gap G illustrated in FIG. 2 is sufficient to permit the serviceman to insert the end of the screwdriver 25 and effect the desired short circuiting of the two pins 23 and 24 in question.

These pins 23 and 24 are preferably disposed adjacent one underside corner of the chip 15, the light emitting diode 19 in turn being on the top side at the said one end opposite the two pins 23 and 24. Moreover, the two pins 23 and 24 may have a color different from the color of the remaining pins. For example, the pins 23 and 24 may be silver plated while the remaining plates are gold plated. A serviceman can thus readily locate the proper pins to short circuit during his routine checking.

Referring now to FIG. 3, there is again illustrated the chip 15 by the phantom lines wherein chip microcircuitry is indicated by the block 26. Further, the pins 23 and 24 are depicted as being short-circuited by the screwdriver blade 25.

Also incorporated into the chip 15 which is typical also of the other chips is an amplifier circuit 27 connected to the micro-circuitry 26 as indicated by the leads 28 and also being biased to provide a sufficient voltage to energize the light emitting diode 19 only when connected thereto and only so long as the micro-circuitry is functioning normally. In other words, if the chip is malfunctioning there is not provided a sufficient voltage output from the micro-circuitry to the amplifier 27 to energize the light emitting diode 19 when the output of the amplifier is connected thereto.

Figure 3:
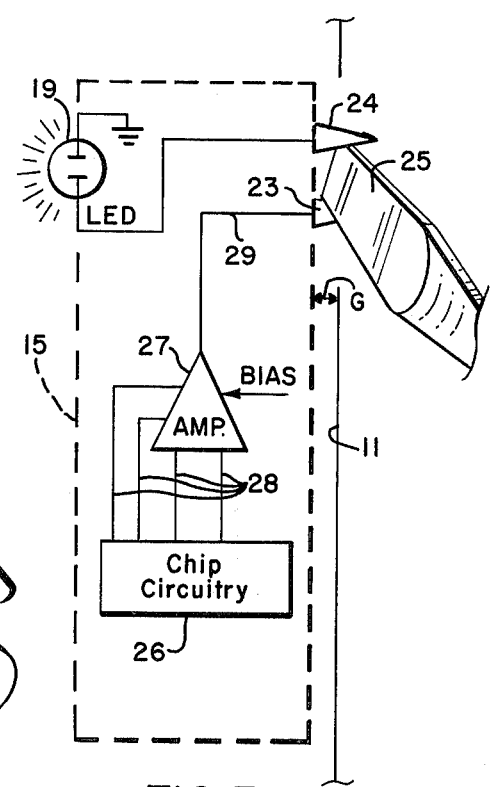

Still referring to FIG. 3, it will be noted that the first pin 23 connects to the amplifier output as by means of lead 29, the other pin 24 connecting directly to one side of the light emitting diode 19, the other side being grounded. With this arrangement, it will be evident that short-circuiting of the pins 23 and 24 simply connects the output of the amplifier 27 directly to the light emitting diode 19.

OPERATION

In operation, the chips and circuit board will function in a normal manner, none of the various light emitting diodes being energized since the specially selected pins such as 23 and 24 for the chip 15 are normally insulated from each other. If now a malfunction occurs in the electronic apparatus, the serviceman in checking out the circuitry need only remove the back panel 22 in the event a television receiver is involved, override the normally provided current lock-out system responsive to removal of the back panel, and then perform quick tests on each of the chips as by means of an appropriate conductive probe or screwdriver. Thus, the serviceman will simply insert the blade of the screwdriver under the appropriate chip pins which can readily be identified by the color coding and by the fact that they are opposite the top side portion of the chip containing the light emitting diode.

In shorting the two pins, the screwdriver end is canted slightly to fit between the pins and then can be rotated to engage opposed sides of the pins within the gap area G simultaneously such as indicated in FIG. 3. If the chip is functioning normally, there will be sufficient voltage provided at the output of the amplifier 27 to energize the light emitting diode 19 in the case of the particular chip 15 set forth by way of example. The serviceman in observing the energization of the light emitting diode will then know that the chip is operating correctly and he will simply leave this chip in circuit.

He will then proceed to the next chip and conduct a similar test.

From all of the foregoing, it will be apparent that the serviceman can immediately determine which one or ones of the various chips are malfunctioning, these chips then being removed with appropriate equipment available to the serviceman and replaced.

The trouble shooting time is greatly reduced as a consequence of this invention in that the necessity for individually removing and replacing each chip to conduct a malfunction test thereon is wholly avoided.

A further advantage of this invention is elimination of the tenedency to throw away an entire unit or board when a malfunction occurs rather than determine the specific chip causing the problem. Because of the ease of trouble shooting provided by this invention, it becomes feasible for a serviceman to pin point problems rather than resort to the older methods of bodily throwing out and replacing whole systems.

While the two pins to be shorted can be color coded as mentioned heretofore and also placed adjacent to each other for easy identification, it might, in certain instances, be desirable to prevent any type of ready identification since lay person's may then attempt to trouble shoot a circuit with poor results. This problem can be avoided by having all pins the same color and then having two arbitrarily selected pins which need not be adjacent and which are identified by a key code known only to the serviceman, serve as the pins to be shorted. Where the pins are not adjacent, a conducting wire of sufficient length to bridge the same would constitute the probe.

Finally, as mentioned briefly heretofore, there is not really any appreciable increase in expense in the provision of the light emitting diodes and amplifier circuitry in each of the chips. The fact that the light emitting diode is normally unenergized or "off" during normal operation, avoids problems of having to replace the light emitting diodes periodically. In other words, they are only energized during actual testing or short-circuiting of the selected pins and therefore the only wear or tear on the light emitting diodes will occur during such testing period.

I claim:

1. A serviceman's electronic malfunction checking system for an electronic chassis supporting a plurality of chips each containing micro-circuitry and connecting pins, in rows extending from one end of the chip to the other end, each of said plurality of chips further including:

(a) a normally de-energized light emitting diode visible from the exterior of the chip when energized;

(b) an amplifier circuit built into said chip and connected to said micro-circuitry in said chip, said amplifier circuit being biased to provide sufficient current to energize said light emitting diode only when connected thereto and only so long as said micro-circuitry is functioning normally; and (c) specially selected first and second ones of said connecting pins respectively connecting to the output of said amplifier circuit and to said light emitting diode so that short circuiting of said first and second pins connects said light emitting diode to said amplifier circuit for energization thereby provided said sufficient current is present, whereby a serviceman can readily check for malfunctioning chips without having to remove the chip from said chassis by simply short circuiting said first and second connecting pins with a conducting probe and observing whether or not said light emitting diode is energized.

2. A system according to claim 1, in which said first and second pins are located as part of one of the rows of normally provided connecting pins at one end of an underside corner of said chip, said light emitting diode being located on the top side of said one end of the chip opposite said pins, each of said pins having a color different from the color of the remaining pins so that said first and second pins are readily identifiable by the service man, the short circuiting being effected by inserting said probe into the normally existing gap to engage the upper portions of said pins visible in said gap between the underside of said chip and said chassis even existing when said chip is properly secured in said chassis.

3. A system according to claim 1, in which said chassis is part of a television receiver, and in which the first and second pins are adjacent to each other and in which said probe is a screwdriver.

* * * * *